(12) United States Patent
Lee et al.

(10) Patent No.: US 9,208,827 B2
(45) Date of Patent: Dec. 8, 2015

(54) SEMICONDUCTOR STACKED PACKAGE

(71) Applicant: SK hynix Inc., Icheon-si, Gyeonggi-do (KR)

(72) Inventors: Ki Yong Lee, Seoul (KR); Jong Hyun Kim, Seoul (KR); Sang Hwan Kim, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/526,802

(22) Filed: Oct. 29, 2014

(65) Prior Publication Data
US 2015/0302900 A1 Oct. 22, 2015

(30) Foreign Application Priority Data
Apr. 18, 2014 (KR) .......................... 10-2014-0046368

(51) Int. Cl.
*H01L 23/48* (2006.01)
*H01L 23/52* (2006.01)
*H01L 29/40* (2006.01)
*H01L 23/02* (2006.01)
*G11C 5/02* (2006.01)
*H01L 25/065* (2006.01)
(Continued)

(52) U.S. Cl.
CPC *G11C 5/025* (2013.01); *G11C 5/14* (2013.01); *G11C 7/109* (2013.01); *G11C 7/1063* (2013.01); *G11C 7/14* (2013.01); *G11C 29/1201* (2013.01); *H01L 23/5256* (2013.01); *H01L 24/09* (2013.01); *H01L 24/49* (2013.01); *H01L 25/0657* (2013.01); *H01L 2224/04042* (2013.01); *H01L 2224/0901* (2013.01); *H01L 2224/0903* (2013.01); *H01L 2224/09179* (2013.01); *H01L 2224/48106* (2013.01); *H01L 2224/48148* (2013.01); *H01L 2224/48227* (2013.01); *H01L 2225/0651* (2013.01); *H01L 2225/06506* (2013.01); *H01L 2225/06562* (2013.01); *H01L 2225/06596* (2013.01); *H01L 2924/1207* (2013.01); *H01L 2924/13091* (2013.01)

(58) Field of Classification Search
CPC ..... G11C 5/025; H01L 25/0657; H01L 24/09
USPC .......................................... 257/686, 678, 777
See application file for complete search history.

(56) References Cited

U.S. PATENT DOCUMENTS 8,710,675 B2 * 4/2014 Kim et al. ...................... 257/777
2006/0138624 A1 * 6/2006 Kwon et al. .................. 257/678
(Continued)

FOREIGN PATENT DOCUMENTS

KR   1020090113679 A   11/2009

*Primary Examiner* — David S Blum
(74) *Attorney, Agent, or Firm* — William Park & Associates Ltd.

(57) ABSTRACT

A semiconductor stacked package may include a substrate formed with a plurality of coupling pads, a plurality of semiconductor chips stacked on the substrate. The semiconductor stacked package may also include first circuit units disposed on each of the semiconductor chips, and electrically connected with the coupling pads by the medium of bonding pads. The semiconductor stacked package may include second circuit units disposed on each of the semiconductor chips and electrically disconnected with the coupling pads, connection pads disposed on each of the semiconductor chips and corresponding to the second circuit units, and blocking circuits coupled between the second circuit units and the connection pads. The semiconductor stacked package may also include bonding wires electrically connecting the bonding pads and the coupling pads.

29 Claims, 20 Drawing Sheets

(51) Int. Cl.
*H01L 23/00* (2006.01)
*G11C 7/14* (2006.01)
*H01L 23/525* (2006.01)
*G11C 7/10* (2006.01)
*G11C 5/14* (2006.01)
*G11C 29/12* (2006.01)

(56) References Cited

U.S. PATENT DOCUMENTS

2010/0301466 A1* 12/2010 Taoka et al. .................. 257/686
2012/0083073 A1* 4/2012 Tanuma et al. ............... 438/125

* cited by examiner

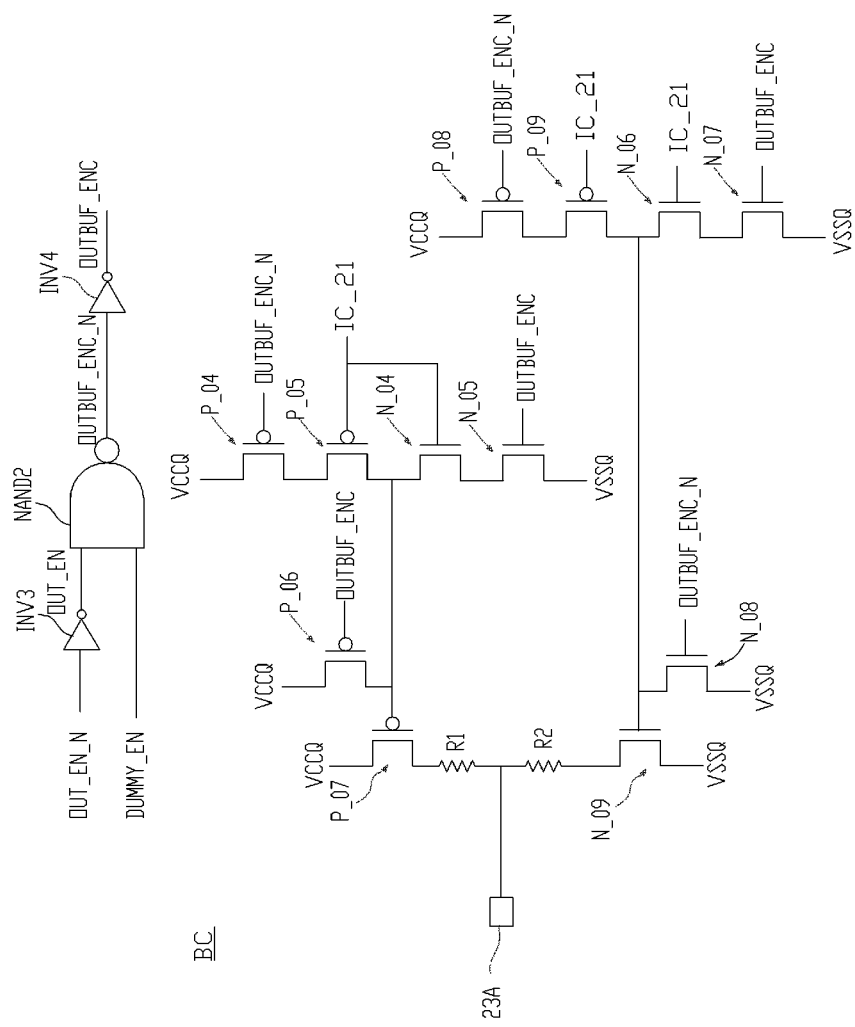

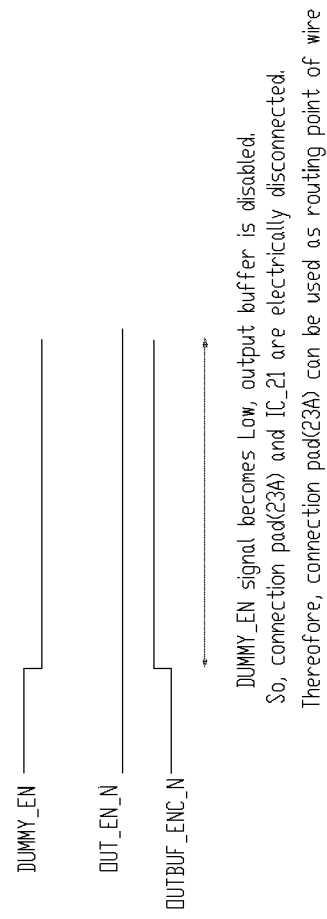

SEMICONDUCTOR STACKED PACKAGE

CROSS-REFERENCE TO RELATED APPLICATION

The present application claims priority under 35 U.S.C. 119(a) to Korean patent application number 10-2014-0046368 filed in the Korean Intellectual Property Office on Apr. 18, 2014, which is incorporated herein by reference in its entirety.

BACKGROUND

1. Technical Field

Various embodiments generally relate to a semiconductor technology, and more particularly, to a semiconductor stacked package.

2. Related Art

Packaging technologies for a semiconductor integrated device are continuously being developed because of the demands associated with miniaturization and increased capacity. Recently, various technologies for a semiconductor stacked package, generally capable of satisfying miniaturization, increased capacity, and as well as greater mounting efficiency needs, are sought after.

The term "stack" that is mentioned in the semiconductor industry may refer to a technology of vertically piling, or arranging together, at least two semiconductor chips or packages. In the case of a memory device, by using a stacking technology, advantages are provided in that it may be possible to realize a product having memory capacity larger than that obtainable through a semiconductor integration process and may also improve mounting area utilization efficiency. In general, in a semiconductor stacked package, signal transmission between semiconductor chips and a substrate may be implemented through bonding wires.

SUMMARY

In an embodiment, a semiconductor stacked package may include a substrate formed with a plurality of coupling pads, a plurality of semiconductor chips stacked on the substrate. The semiconductor stacked package may also include first circuit units disposed on each of the semiconductor chips, and electrically connected with the coupling pads by the medium of bonding pads. The semiconductor stacked package may also include second circuit units disposed on each of the semiconductor chips and electrically disconnected with the coupling pads. The semiconductor stacked package may include connection pads disposed on each of the semiconductor chips and corresponding to the second circuit units, blocking circuits coupled between the second circuit units and the connection pads, and bonding wires electrically connecting the bonding pads and the coupling pads.

BRIEF DESCRIPTION OF THE DRAWINGS

FIG. 7A is a representation of a circuit diagram illustrating an example of the blocking circuit illustrated in FIG. 3.

FIG. 7B is a representation of an operation waveform diagram of signals associated with the circuit diagram illustrated in FIG. 7A.

DETAILED DESCRIPTION

Hereinafter, a semiconductor stacked package will be described below with reference to the accompanying drawings through various examples of embodiments.

Various embodiments may be directed to semiconductor stacked packages that may be suitable for improving the electrical connection reliability of bonding wires and to improve the efficiency in designing the pads of a semiconductor chip.

Figure 1:
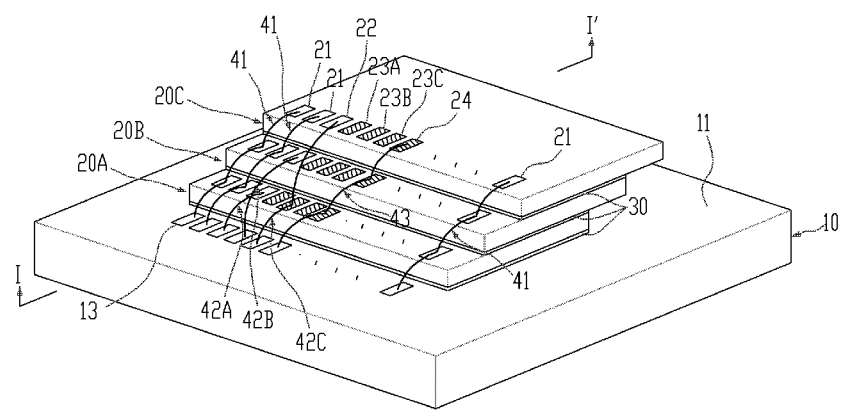
FIG. 1 is a perspective view illustrating a representation of a semiconductor stacked package in accordance with an embodiment.
Figure 2:
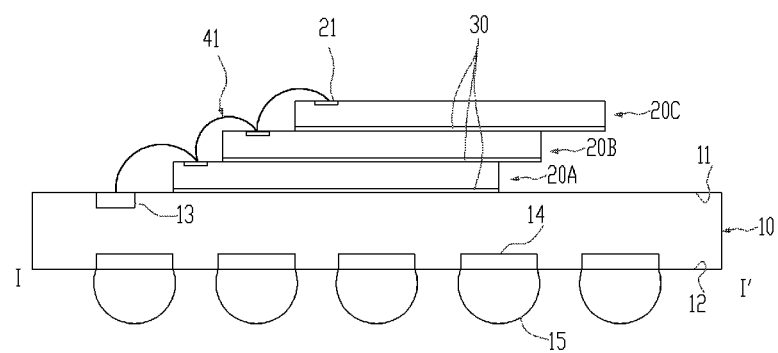
FIG. 2 is a cross-sectional representation of a view taken along the line I-I' of FIG. 1.

Referring to FIGS. 1 and 2, a substrate 10 may have a top surface 11 and a bottom surface 12. A plurality of coupling pads 13 may be formed on the top surface 11 of the substrate 10, and a plurality of external electrodes 14 may be formed on the bottom surface 12 of the substrate 10. External connection terminals 15 such as solder balls may be attached to the external electrodes 14.

A plurality of semiconductor chips 20A, 20B and 20C may be stacked on the top surface 11 of the substrate 10. While it is illustrated in the embodiments, for the sake of convenience in explanation, that 3 semiconductor chips 20A, 20B and 20C are stacked, the technical spirit of the embodiments are not limited to the cases where the number of semiconductor chips to be stacked is 3, and it is to be noted that the number of semiconductor chips to be stacked may be 2 or 4 or more.

The semiconductor chips 20A, 20B and 20C may have substantially the same structure.

Figure 3:
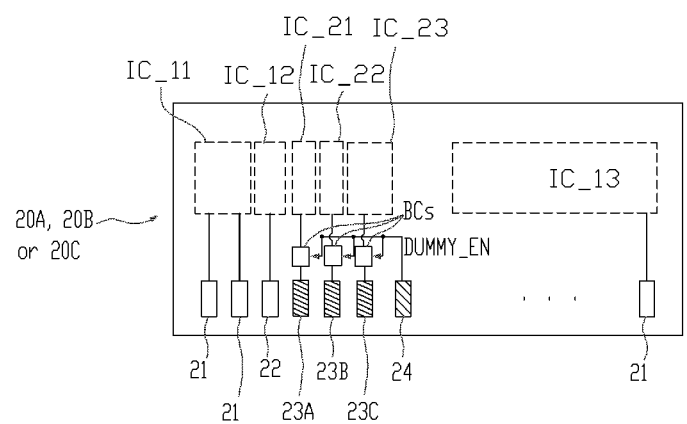
FIG. 3 is a representation of a view schematically illustrating an example of the semiconductor chip illustrated in FIG. 1.

Referring to FIG. 3, a plurality of circuit units IC_11, IC_12, IC_13, IC_21, IC_22 and IC_23 may be formed in the respective semiconductor chips 20A, 20B and 20C to realize various functions necessary for chip operations. While it is illustrated in the embodiments, for the sake of convenience in explanation, that the number of circuit units is 6, the technical spirit of the embodiments are not limited to such, and it is to be noted that the number of circuit units may be less or more than 6.

The circuit units IC_11, IC_12, IC_13, IC_21, IC_22 and IC_23 may include, for example, a data storage circuit unit for storing data, a data processing circuit unit for processing data, a test logic circuit unit, and optional circuit units.

The test logic circuit unit is to test, for example, whether a chip is functioning as wanted or not. Such a test logic circuit unit may be used for a chip test at the final stage of a wafer level, and may not be used at a package level. The optional circuit units are to apply the same chip to various kinds of packages and various different applications. Such optional circuit units may be used or not be used at a package level according to the kind of a package or an application to be applied. The optional circuit units may include, for example, an SD_SEL circuit unit, a QD_SEL circuit unit, an FB circuit unit, an INT circuit unit, and a TOKEN circuit unit. The SD_SEL circuit unit represents a circuit for realizing a DDP (dual die package) option in which two chips are allocated to one chip enable signal (hereinafter, referred to as 'CE signal'), and the QD_SEL circuit unit represents a circuit for realizing a QDP (quad die package) option in which four chips are allocated to one CE signal. The FB (front back) circuit unit represents a circuit for distinguishing chips allocated to one CE signal in the DDP option or the QDP option, and the INT circuit unit represents a circuit for distinguishing a plurality of chip enable pads (hereinafter, referred to as 'CE pads') present in a single chip in the case where a plurality of CE pads are present in a single chip. The TOKEN circuit unit represents a circuit used to sense peak current. In the case of an ODP (octa-die package) in which the number of CE signals is eight and the number of chips is eight as well or a package which includes chips more than eight, the SD_SEL circuit unit, the QD_SEL circuit unit, the FB circuit unit and the INT circuit unit, which are used in a semiconductor stacked package having four or fewer chips, may not be used.

In this way, not all the circuit units IC_11, IC_12, IC_13, IC_21, IC_22 and IC_23 are used at a package level, and some circuit units may not be used at a package level in a specific application.

In the embodiments, among the circuit units IC_11, IC_12, IC_13, IC_21, IC_22 and IC_23, the circuit units designated by the reference symbols IC_11, IC_12 and IC_13 represent circuit units which may be used at a package level, and the circuit units designated by the reference symbols IC_21, IC_22 and IC_23 represent circuit units which may not be used at a package level. In the following descriptions, for the sake of convenience in explanation, the circuit units IC_11, IC_12 and IC_13 which may be used at a package level are defined as first circuit units, and the circuit units IC_21, IC_22 and IC_23 which may not be used at a package level are defined as second circuit units. The data storage circuit unit and the data processing circuit unit may be included in the first circuit units, and the test logic circuit unit may be included in the second circuit units. Meanwhile, the optional circuit units may be included in the first circuit units and may be included in the second circuit units, according to the kind of a package or an application to be applied.

The first circuit units IC_11, IC_12 and IC_13, which are used at a package level, may be electrically connected with the substrate 10 to exchange signals with the substrate 10, whereas the second circuit units IC_21, IC_22 and IC_23, which are not used at a package level, may be electrically disconnected with the substrate 10.

Among the first circuit units IC_11, IC_12 and IC_13 of the semiconductor chips 20A, 20B and 20C, some circuit units may be electrically connected with the first circuit units of other semiconductor chips stacked together, and some circuit units may not be electrically connected with other semiconductor chips stacked together. In FIG. 3, for example, the first circuit units designated by the reference symbols IC_11 and IC_13 represent first circuit units which are electrically connected with the first circuit units of other semiconductor chips stacked together, and the first circuit unit designated by the reference symbol IC_12 represents a first circuit unit which is not electrically connected with the first circuit unit of other semiconductor chips stacked together. In the following descriptions, for the sake of convenience in explanation, the first circuit units IC_11 and IC_13, which are electrically connected with the first circuit units of other semiconductor chips stacked together, are defined as belonging to a first group, and the first circuit unit IC_12, which is not electrically connected with the first circuit unit of other semiconductor chips stacked together, is defined as belonging to a second group.

Although it is illustrated in the embodiments that each of the semiconductor chips 20A, 20B, and 20C include three first circuit units IC_11, IC_12 and IC_13 and three second circuit units IC_21, IC_22 and IC_23, the technical spirit of the embodiments are not limited to such, and it is to be noted that all cases where at least one first circuit unit and at least one second circuit unit included in each of the semiconductor chips 20A, 20B, and 20C that are used fall under the scope of protection of the embodiments.

First bonding pads 21, a second bonding pad 22, connection pads 23A, 23B and 23C, and a third bonding pad 24 may be formed on the top surface of each of the semiconductor chips 20A, 20B and 20C.

The first bonding pads 21 may respectively correspond to the first circuit units IC_11 and IC_13 of the first group, and may be electrically connected with the corresponding first circuit units IC_11 and IC_13. The second bonding pad 22 may correspond to the first circuit unit IC_12 of the second group, and may be electrically connected with the corresponding first circuit unit IC_12. The connection pads 23A, 23B and 23C may respectively correspond to the second circuit units IC_21, IC_22 and IC_23, and may be electrically connected with the corresponding second circuit units IC_21, IC_22 and IC_23. The third bonding pad 24 may be electrically connected with blocking circuits BCs which will be described later.

In an embodiment, the first bonding pads 21, the second bonding pad 22, the connection pads 23A, 23B and 23C, and the third bonding pad 24 may be arranged in a line adjacent to and along one edge of the top surface of each of the semiconductor chips 20A, 20B and 20C. While it is illustrated and described in the embodiments, for the sake of convenience in explanation, that the first bonding pads 21, the second bonding pad 22, the connection pads 23A, 23B and 23C, and the third bonding pad 24 are arranged in a line adjacent to and along one edge of the top surface of each of the semiconductor chips 20A, 20B and 20C, the technical spirit of the embodiments are not limited to such, and it is to be noted that the first bonding pads 21, the second bonding pad 22, the connection pads 23A, 23B and 23C, and the third bonding pad 24 may be arranged adjacent to and along at least two edges of the top surface of each of the semiconductor chips 20A, 20B and 20C and may be arranged in at least two lines.

Referring now to FIG. 1, the semiconductor chips 20A, 20B and 20C may be stacked in a step-like shape on the top surface 11 of the substrate 10 in such a manner that the first bonding pads 21, the second bonding pad 22, the connection pads 23A, 23B and 23C, and the third bonding pad 24 are exposed. Adhesive members 30 may be disposed between the substrate 10 and the lowermost semiconductor chip 20A and between the semiconductor chips 20A, 20B and 20C, and may attach the substrate 10 and the semiconductor chips 20A, 20B and 20C to one another.

The first bonding pads 21 may be electrically connected with the coupling pads 13 of the substrate 10 through first bonding wires 41. The respective first bonding wires 41 may electrically connect the first bonding pads 21 of the uppermost semiconductor chip 20C and the first bonding pads 21 of the intermediate semiconductor chip 20B, may electrically connect the first bonding pads 21 of the intermediate semiconductor chip 20B and the first bonding pads 21 of the lowermost semiconductor chip 20A, and may electrically connect the first bonding pads 21 of the lowermost semiconductor chip 20A and the coupling pads 13 of the substrate 10. Though not shown, in an embodiment, each of the first bonding wires may be divided into a plurality of sub wires. Each of the sub wires may connect each of the first bonding pads and the coupling pads.

The second bonding pads 22 of the semiconductor chips 20A, 20B and 20C may be electrically connected with the coupling pads 13 of the substrate 10 through second bonding wires 42A, 42B and 42C. The second bonding wire designated by the reference numeral 42A may electrically connect the second bonding pad 22 of the lowermost semiconductor chip 20A and the coupling pad 13 of the substrate 10, and the second bonding wire designated by the reference numeral 42B may electrically connect the second bonding pad 22 of the intermediate semiconductor chip 20B and the coupling pad 13 of the substrate 10.

The second bonding wire designated by the reference numeral 42C may electrically connect the second bonding pad 22 of the uppermost semiconductor chip 20C and the connection pad 23B of the lowermost semiconductor chip 20A and may then electrically connect the connection pad 23B of the lowermost semiconductor chip 20A and the coupling pad 13 of the substrate 10. In this regard, while the second bonding wire 42C electrically connecting the second bonding pad 22 of the uppermost semiconductor chip 20C and the coupling pad 13 of the substrate 10, the distance between target connection objects is substantially long. Therefore, in the case where the target connection objects are directly electrically connected, since the length of a bonding wire is lengthened, problems may be caused due to the substantial length of the bonding wire. For example, bonding wires are likely to short-circuit and bonding wires and semiconductor chips are likely to short-circuit. In order to cope with such a problem, in an embodiment, the connection pad 23B corresponding to the second circuit unit IC_22 which is electrically disconnected with the substrate 10 may be used as an intermediate routing point through which the second bonding wire 42C passes. Though not shown, in an embodiment, the second bonding wire may be divided into two sub wires. One sub wire may connect the second bonding pad and the connection pad, the other sub wire may connect the connection pad and the coupling pad.

Figure 16:
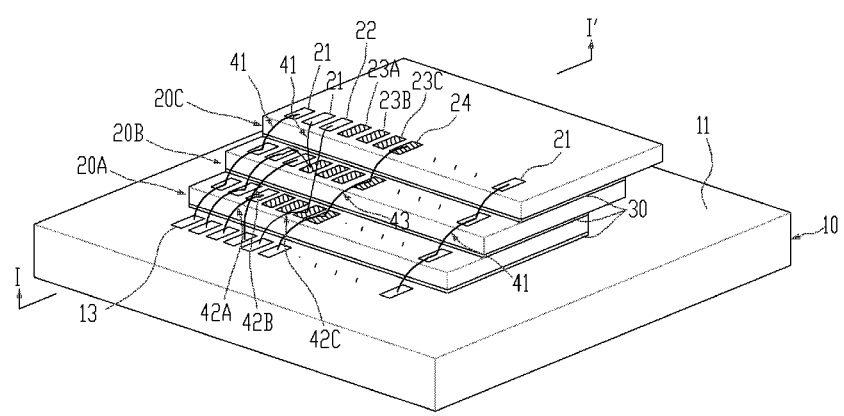
FIG. 16 is a perspective view illustrating a representation of a semiconductor stacked package in accordance with an embodiment.

Although it is illustrated in an embodiment that the second bonding wire 42C passes through the connection pad 23B of the lowermost semiconductor chip 20A, the technical spirit of the embodiments are not limited to such, and it is to be noted that all cases where at least one among all the bonding wires including the first bonding wires 41 and the second bonding wires 42A, 42B and 42C formed in the package passes through at least one among the connection pads 23A, 23B and 23C corresponding to the second circuit units IC_21, IC_22 and IC_23 which are not used at a package level fall under the scope of protection of the embodiments. For example, as illustrated in the FIG. 16, at least one among the first bonding wires 41 may pass through the connection pad 23A of the intermediate semiconductor chip 20B.

In order to allow the connection pads 23A, 23B and 23C to be used as intermediate routing points for the bonding wires, it may be necessary to electrically disconnect the connection pads 23A, 23B and 23C and the second circuit units IC_21, IC_22 and IC_23. When exemplifying the cases where the second circuit units IC_21, IC_22 and IC_23 are test logic circuit units, the connection pads 23A, 23B and 23C and the second circuit units IC_21, IC_22 and IC_23 should be electrically connected to transmit signals between the second circuit units IC_21, IC_22 and IC_23 and test equipment in a wafer level test. In this regard, if the connection pads 23A, 23B and 23C are used as the intermediate routing points for the bonding wires in the state in which the connection pads 23A, 23B and 23C and the second circuit units IC_21, IC_22 and IC_23 are electrically connected, unwanted electrical connections may be formed and miss operations may be caused. For this reason, it may be necessary to electrically disconnect the connection pads 23A, 23B and 23C and the second circuit units IC_21, IC_22 and IC_23.

Referring now to FIG. 3, in order to electrically disconnect the connection pads 23A, 23B and 23C and the second circuit units IC_21, IC_22 and IC_23, the respective semiconductor chips 20A, 20B and 20C may include blocking circuits BCs which may be respectively electrically connected between the connection pads 23A, 23B and 23C and the second circuit units IC_21, IC_22 and IC_23 corresponding to them.

The blocking circuits BCs may be electrically connected between the connection pads 23A, 23B and 23C and the second circuit units IC_21, IC_22 and IC_23 corresponding to them, and may electrically disconnect the connection pads 23A, 23B and 23C and the second circuit units IC_21, IC_22 and IC_23 corresponding to them, in response to a dummy pad enable signal DUMMY_EN.

In an embodiment, the blocking circuits BCs may be electrically connected to the third bonding pad 24, and may be provided with the dummy pad enable signal DUMMY_EN from the third bonding pad 24.

Referring again to FIG. 1, the third bonding pads 24 of the semiconductor chips 20A, 20B and 20C may be electrically connected to the coupling pad 13 of the substrate 10 through a third bonding wire 43, and may be provided with the dummy pad enable signal DUMMY_EN from the substrate 10.

Various embodiments of the blocking circuit BC are illustrated in FIGS. 4 to 8. In the following descriptions which will be made with reference to FIGS. 4 to 8, the blocking circuit BC which may be electrically connected between the connection pad designated by the reference numeral 23A and the second circuit unit designated by the reference numeral IC_21 will be representatively described among the blocking circuit BCs, for the sake of convenience in explanation.

Figure 4:
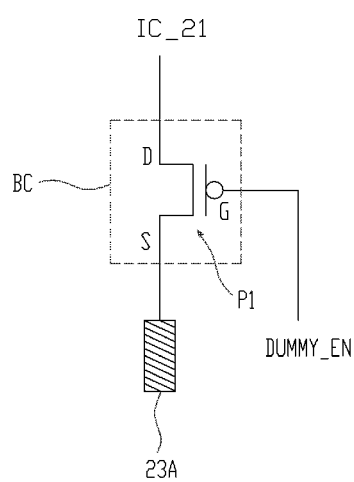
FIG. 4 is a representation of a circuit diagram illustrating an example of the blocking circuit illustrated in FIG. 3.

Referring to FIG. 4, a blocking circuit BC may be configured by a PMOS transistor P1 having a source S which is electrically connected to the connection pad 23A, a drain D which is electrically connected to the second circuit unit IC_21, and a gate G to which the dummy pad enable signal DUMMY_EN is inputted.

In an embodiment, the third bonding pads 24 of the semiconductor chips 20A, 20B and 20C illustrated in FIG. 1 may be electrically connected with a coupling pad 13 for a power supply voltage, among the coupling pads 13 of the substrate 10, through the third bonding wire 43. Accordingly, the dummy pad enable signal DUMMY_EN of a power supply voltage level, that is, a high level, may be inputted to the third bonding pads 24 of the semiconductor chips 20A, 20B and 20C through the third bonding wire 43 from the coupling pad 13 for a power supply voltage, of the substrate 10.

Referring again to FIG. 4, the PMOS transistor P1 which configures the blocking circuit BC is turned off in response to the dummy pad enable signal DUMMY_EN being at a high level which is inputted from the third bonding pad 24, and accordingly, the connection pad 23A is electrically disconnected from the second circuit unit IC_21. Therefore, the connection pad 23A may be used as the intermediate routing point of the bonding wire.

Figure 5:
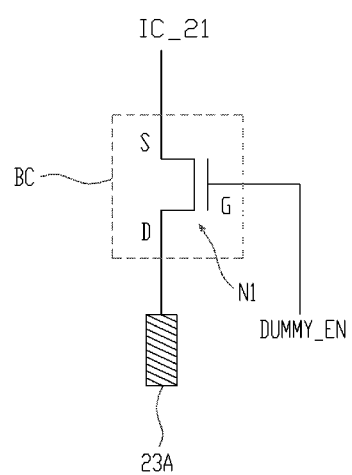
FIG. 5 is a representation of a circuit diagram illustrating an example of the blocking circuit illustrated in FIG. 3.

Referring to FIG. 5, a blocking circuit BC may be configured by an NMOS transistor N1 having a drain D which is electrically connected to the connection pad 23A, a source S which is electrically connected to the second circuit unit IC_21, and a gate G to which the dummy pad enable signal DUMMY_EN may be inputted.

In an embodiment, the third bonding pads 24 of the semiconductor chips 20A, 20B and 20C illustrated in FIG. 1 may be electrically connected with a coupling pad 13 for a ground voltage, among the coupling pads 13 of the substrate 10, through the third bonding wire 43. Accordingly, the dummy pad enable signal DUMMY_EN of a ground voltage level, that is, a low level, may be inputted to the third bonding pads 24 of the semiconductor chips 20A, 20B and 20C through the third bonding wire 43 from the coupling pad 13 for a ground voltage, of the substrate 10.

Referring again to FIG. 5, the NMOS transistor N1 of the blocking circuit BC is turned off in response to the dummy pad enable signal DUMMY_EN being at a low level which is inputted from the third bonding pad 24, and accordingly, the connection pad 23A is electrically disconnected from the second circuit unit IC_21. Therefore, the connection pad 23A may be used as the intermediate routing point of the bonding wire.

Figure 6A:
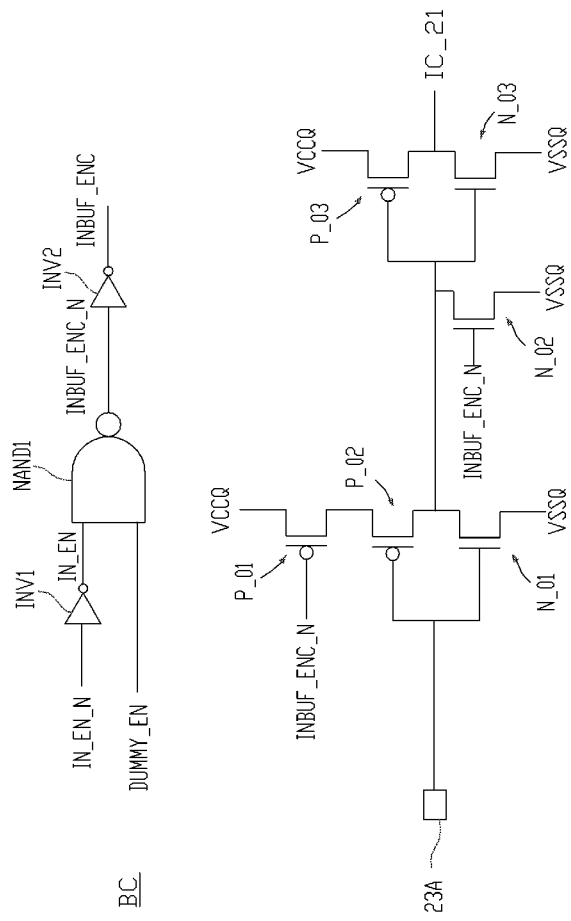
FIG. 6A is a representation of a circuit diagram illustrating an example of the blocking circuit illustrated in FIG. 3.

Referring to FIG. 6A, a blocking circuit BC may be configured by an input buffer which is electrically connected between the connection pad 23A and the second circuit unit IC_21 corresponding to it and is disabled in response to the dummy pad enable signal DUMMY_EN.

The input buffer may be configured by a first inverter INV1 which inverts an input enable bar signal IN_EN_N and generates an input enable signal IN_EN, a first NAND gate NAND1 which NANDs the dummy pad enable signal DUMMY_EN and the input enable signal IN_EN and generates an input buffer enable control bar signal INBUF_ENC_N. The input buffer may also include a second inverter INV2 which inverts the input buffer enable control bar signal INBUF_ENC_N and outputs an input buffer enable control signal INBUF_ENC. The input buffer may also include a first PMOS transistor P_01 which has one end electrically connected to a power supply voltage VCCQ and the gate inputted with the input buffer enable control bar signal INBUF_ENC_N. The input buffer may also include a second PMOS transistor P_02 which has one end electrically connected to the other end of the first PMOS transistor P_01 and the gate electrically connected to the connection pad 23A. The input buffer may also include a first NMOS transistor N_01 which is electrically connected between the other end of the second PMOS transistor P_02 and a ground voltage VSSQ and has the gate electrically connected to the connection pad 23A. The input buffer may also include a second NMOS transistor N_02 which has one end electrically connected to the other end of the second PMOS transistor P_02, the other end electrically connected to the ground voltage VSSQ and the gate inputted with the input buffer enable control bar signal INBUF_ENC_N. The input buffer may also include a third PMOS transistor P_03 which has one end electrically connected to the power supply voltage VCCQ and the gate electrically connected to the one end of the second NMOS transistor N_02, and a third NMOS transistor N_03 which is electrically connected between the other end of the third PMOS transistor P_03 and the ground voltage VSSQ and has the gate electrically connected to the one end of the second NMOS transistor N_02.

In an embodiment, the third bonding pads 24 of the semiconductor chips 20A, 20B and 20C illustrated in FIG. 1 may be electrically connected with a coupling pad 13 for a ground voltage, among the coupling pads 13 of the substrate 10, through the third bonding wire 43. Accordingly, the dummy pad enable signal DUMMY_EN of a ground voltage level, that is, a low level, may be inputted to the third bonding pads 24 of the semiconductor chips 20A, 20B and 20C through the third bonding wire 43 from the coupling pad 13 for a ground voltage, of the substrate 10.

Figure 6B:
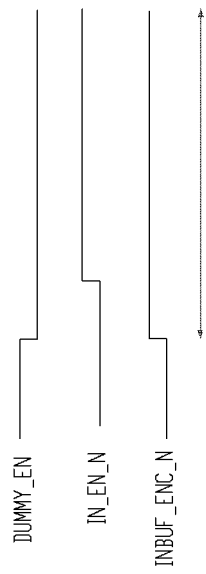
FIG. 6B is a representation of an operation waveform diagram of signals associated with the circuit diagram illustrated in FIG. 6A.

Referring to FIGS. 6A and 6B, if the dummy pad enable signal DUMMY_EN having a low level is inputted to the first NAND gate NAND1 from the third bonding pad 24, the first NAND gate NAND1 outputs the input buffer enable control bar signal INBUF_ENC_N at a high level regardless of the input enable signal IN_EN, and the second inverter INV2 inverts the input buffer enable control bar signal INBUF_ENC_N and outputs the input buffer enable control signal INBUF_ENC at a low level.

In response to the input buffer enable control bar signal INBUF_ENC_N having a high level, the first PMOS transistor P_01 is turned off and the second NMOS transistor N_02 is turned on.

Accordingly, a signal at a low level is inputted to the second circuit unit IC_21 regardless of the signal of the connection pad 23A. That is to say, the connection pad 23A and the second circuit unit IC_21 are electrically disconnected. Thus, the connection pad 23A may be used as the intermediate routing point of a bonding wire.

Referring to FIG. 7A, a blocking circuit BC may be configured by an output buffer which is electrically connected between the connection pad 23A and the second circuit unit IC_21 corresponding to it and is disabled in response to the dummy pad enable signal DUMMY_EN.

The output buffer may include a third inverter INV3 which inverts an output enable bar signal OUT_EN_N and generates an output enable signal OUT_EN, a second NAND gate NAND2 which NANDs the dummy pad enable signal DUMMY_EN and the output enable signal OUT_EN and generates an output buffer enable control bar signal OUT- BUF_ENC_N. The output buffer may also include a fourth inverter INV4 which inverts the output buffer enable control bar signal OUTBUF_ENC_N and generates an output buffer enable control signal OUTBUF_ENC. The output buffer may also include a fourth PMOS transistor P_04 which has one end electrically connected to a power supply voltage VCCQ and the gate inputted with the output buffer enable control bar signal OUTBUF_ENC_N, and a fifth PMOS transistor P_05 which has one end electrically connected to the other end of the fourth PMOS transistor P_04 and the gate electrically connected to the second circuit unit IC_21. The output buffer may also include a fourth NMOS transistor N_04 which has one end electrically connected to the other end of the fifth PMOS transistor P_05 and the gate electrically connected to the second circuit unit IC_21, and a fifth NMOS transistor N_05 which is electrically connected between the other end of the fourth NMOS transistor N_04 and a ground voltage VSSQ and has the gate inputted with the output buffer enable control signal OUTBUF_ENC. The output buffer may also include a sixth PMOS transistor P_06 which has one end electrically connected to the power supply voltage VCCQ, the other end electrically connected to the other end of the fifth PMOS transistor P_05 and the gate inputted with the output buffer enable control signal OUTBUF_ENC. The output buffer may also include a seventh PMOS transistor P_07 which has one end electrically connected to the power supply voltage VCCQ, the other end electrically connected to the connection pad 23A through a first resistor R1 and the gate electrically connected to the other end of the sixth PMOS transistor P_06, an eighth PMOS transistor P_08 which has one end electrically connected to the power supply voltage VCCQ and the gate inputted with the output buffer enable control bar signal OUTBUF_ENC_N. The output buffer may also include a ninth PMOS transistor P_09 which has one end electrically connected to the other end of the eighth PMOS transistor P_08 and the gate electrically connected to the second circuit unit IC_21, and a sixth NMOS transistor N_06 which has one end electrically connected to the other end of the ninth PMOS transistor P_09 and the gate electrically connected to the second circuit unit IC_21. The output buffer may also include a seventh NMOS transistor N_07 which is electrically connected between the other end of the sixth NMOS transistor N_06 and the ground voltage VSSQ and has the gate inputted with the output buffer enable control signal OUTBUF_ENC, an eighth NMOS transistor N_08 which has one end electrically connected to the other end of the ninth PMOS transistor P_09, the other end electrically connected to the ground voltage VSSQ and the gate inputted with the output buffer enable control bar signal OUTBUF_ENC_N. The output buffer may also include a ninth NMOS transistor N_09 which has one end electrically connected to the connection pad 23A through a second resistor R2, the other end electrically connected to the ground voltage VSSQ and the gate electrically connected to the one end of the eighth NMOS transistor N_08.

In these cases, the third bonding pads 24 of the semiconductor chips 20A, 20B and 20C illustrated in FIG. 1 may be electrically connected with a coupling pad 13 for a ground voltage, among the coupling pads 13 of the substrate 10, through the third bonding wire 43. Accordingly, the dummy pad enable signal DUMMY_EN of a ground voltage level, that is, a low level, may be inputted to the third bonding pads 24 of the semiconductor chips 20A, 20B and 20C through the third bonding wire 43 from the coupling pad 13 for a ground voltage, of the substrate 10.

Referring to FIGS. 7A and 7B, if the dummy pad enable signal DUMMY_EN having a low level is inputted to the second NAND gate NAND2 from the third bonding pad 24, the second NAND gate NAND2 outputs the output buffer enable control bar signal OUTBUF_ENC_N having a high level regardless of the output enable signal OUT_EN, and the fourth inverter INV4 inverts the output buffer enable control bar signal OUTBUF_ENC_N and outputs the output buffer enable control signal OUTBUF_ENC having a low level.

The fourth and eighth PMOS transistors P_04 and P_08 are turned off in response to the output buffer enable control bar signal OUTBUF_ENC_N having a high level, and the fifth and seventh NMOS transistors N_05 and N_07 are turned off in response to the output buffer enable control signal OUTBUF_ENC having a low level. Moreover, the sixth PMOS transistor P_06 is turned on in response to the output buffer enable control signal OUTBUF_ENC having a low level, and the eighth NMOS transistor N_08 is turned on in response to the output buffer enable control bar signal OUTBUF_ENC_N having a high level. Further, as the sixth PMOS transistor P_06 is turned on and the power supply voltage VCCQ is inputted to the gate of the seventh PMOS transistor P_07, the seventh PMOS transistor P_07 is turned off, and, as the eighth NMOS transistor N_08 is turned on and the ground voltage VSSQ is inputted to the gate of the ninth NMOS transistor N_09, the ninth NMOS transistor P_09 is turned off. Accordingly, no signal is outputted to the connection pad 23A, regardless of the signal outputted from the second circuit unit IC_21. That is to say, the connection pad 23A and the second circuit unit IC_21 are electrically disconnected. Thus, the connection pad 23A may be used as the intermediate routing point of a bonding wire.

Figure 8:
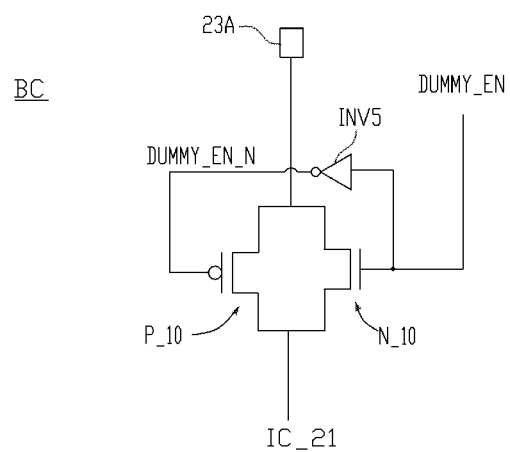
FIG. 8 is a representation of a circuit diagram illustrating an example of the blocking circuit illustrated in FIG. 3.

Referring to FIG. 8, a blocking circuit BC may be configured by a transfer gate which is electrically connected between the connection pad 23A and the second circuit unit IC_21 corresponding to it and is disabled in response to the dummy pad enable signal DUMMY_EN.

The transfer gate may include a tenth NMOS transistor N_10 which is electrically connected between the connection pad 23A and the second circuit unit IC_21 corresponding to it and has the gate inputted with the dummy pad enable signal DUMMY_EN, a fifth inverter INV5 which inverts the dummy pad enable signal DUMMY_EN and outputs a dummy pad enable bar signal DUMMY_EN_N, and a tenth PMOS transistor P_10 which is electrically connected between the connection pad 23A and the second circuit unit IC_21 corresponding to it and has the gate inputted with the dummy pad enable bar signal DUMMY_EN_N.

In these cases, the third bonding pads 24 of the semiconductor chips 20A, 20B and 20C illustrated in FIG. 1 may be electrically connected with a coupling pad 13 for a ground voltage, among the coupling pads 13 of the substrate 10, through the third bonding wire 43. Accordingly, the dummy pad enable signal DUMMY_EN of a ground voltage level, that is, a low level, may be inputted to the third bonding pads 24 of the semiconductor chips 20A, 20B and 20C through the third bonding wire 43 from the coupling pad 13 for a ground voltage, of the substrate 10.

Referring back to FIG. 8, if the dummy pad enable signal DUMMY_EN having a low level is inputted from the third bonding pad 24, the tenth NMOS transistor N_10 is turned off in response to the dummy pad enable signal DUMMY_EN having a low level, and the tenth PMOS transistor P_10 is turned off in response to the dummy pad enable bar signal DUMMY_EN_N having a high level, by which the connection pad 23A and the second circuit unit IC_21 are electrically disconnected. Thus, the connection pad 23A may be used as the intermediate routing point of a bonding wire.

While the blocking circuit BC electrically connected between the connection pad designated by the reference numeral 23A and the second circuit unit IC_21 corresponding to it is illustrated in the embodiments described above with reference to FIGS. 4 to 8, it is to be noted that the blocking circuits BCs electrically connected between the connection pads designated by the reference numerals 23B and 23C and the second circuit units IC_22 and IC_23 corresponding to them may have the same configurations as the blocking circuit BC illustrated in FIGS. 4 to 8. Therefore, similarly to the connection pad 23A, the connection pads 23B and 23C may be used as the intermediate routing points of bonding wires.

Figure 9:
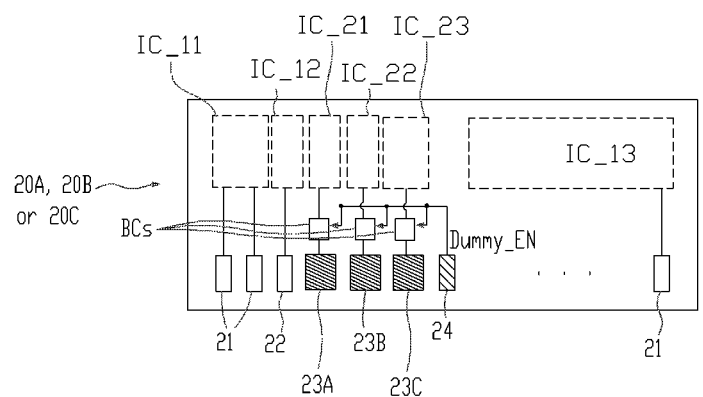
FIG. 9 is a view illustrating a representation of an example of the semiconductor chip illustrated in FIG. 1.

While it is illustrated in the embodiments described above with reference to FIGS. 1 to 3 that the connection pads 23A, 23B and 23C have the same size or substantially the same size as the first bonding pads 21 and the second bonding pad 22, the technical spirit of the embodiments are not limited to such. For example, as illustrated in FIG. 9, the connection pads 23A, 23B and 23C may be formed to have a larger size than the first bonding pads 21 and the second bonding pad 22 such that bonding wires with various shapes may pass through the connection pads 23A, 23B and 23C.

The present disclosure is not limited to the embodiments which have been described above with reference to FIGS. 1 to 9, and may be modified into various types. Such modified embodiments will become more apparent through the following descriptions.

Figure 10:
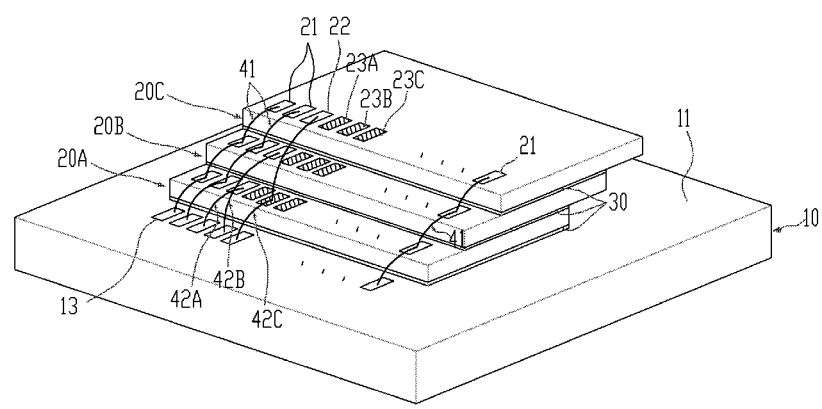
FIG. 10 is a perspective view illustrating a representation of a semiconductor stacked package in accordance with an embodiment.

Referring to FIG. 10, semiconductor chips 20A, 20B and 20C are stacked on a top surface 11 of a substrate 10 which is formed with a plurality of coupling pads 13.

Figure 11:
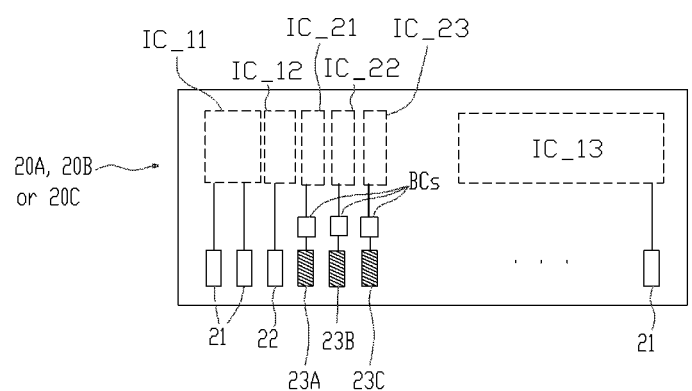
FIG. 11 is a view schematically illustrating a representation of an example of the semiconductor chip illustrated in FIG. 10.

Referring to FIG. 11, each of the semiconductor chips 20A, 20B and 20C may include first circuit units IC_11, IC_12 and IC_13 which are used at a package level and second circuit units IC_21, IC_22 and IC_23 which are not used at a package level. The first circuit units IC_11, IC_12 and IC_13 which are used at a package level are electrically connected with the substrate 10 to exchange signals with the substrate 10. The second circuit units IC_21, IC_22 and IC_23 which are not used at a package level are electrically disconnected with the substrate 10.

Among the first circuit units IC_11, IC_12 and IC_13 of the semiconductor chips 20A, 20B and 20C, some circuit units may be electrically connected with the first circuit units of other semiconductor chips stacked together, and some circuit units may be electrically disconnected with the first circuit units of other semiconductor chips stacked together. In FIG. 11, the first circuit units designated by the reference symbols IC_11 and IC_13 may represent first circuit units which are electrically connected with the first circuit units of other semiconductor chips stacked together. The first circuit unit designated by the reference symbol IC_12 may represent a first circuit unit which is electrically disconnected with the first circuit unit or the first circuit units of other semiconductor chips stacked together. In the following descriptions, for the sake of convenience in explanation, the first circuit units IC_11 and IC_13, which are electrically connected with the first circuit units of other semiconductor chips stacked together, are defined as belonging to a first group, and the first circuit unit IC_12, which is electrically disconnected with the first circuit unit of other semiconductor chips stacked together, is defined as belonging to a second group.

Although it is illustrated in an embodiment that each of the semiconductor chips 20A, 20B, 20C includes 3 first circuit units IC_11, IC_12 and IC_13 and 3 second circuit units IC_21, IC_22 and IC_23, the technical spirit of the embodiments are not limited to such, and it is to be noted that all cases where at least one first circuit unit and at least one second circuit unit included in each of the semiconductor chips 20A, 20B, 20C are used fall under the scope of protection of the embodiments.

First bonding pads 21, a second bonding pad 22, and connection pads 23A, 23B and 23C are formed adjacent to and along one edge of the top surface of each of the semiconductor chips 20A, 20B and 20C. The first bonding pads 21 may respectively correspond to the first circuit units IC_11 and IC_13 which belong to the first group, and may be electrically connected with the corresponding first circuit units IC_11 and IC_13. The second bonding pad 22 may correspond to the first circuit unit IC_12 which belongs to the second group, and may be electrically connected with the corresponding first circuit unit IC_12. The connection pads 23A, 23B and 23C may respectively correspond to the second circuit units IC_21, IC_22 and IC_23, and may be electrically connected with the corresponding second circuit units IC_21, IC_22 and IC_23.

Referring again to FIG. 10, the semiconductor chips 20A, 20B and 20C may be stacked in a step-like shape in such a manner that the first bonding pads 21, the second bonding pad 22, and the connection pads 23A, 23B and 23C are exposed. Adhesive members 30 may be formed between the substrate 10 and the lowermost semiconductor chip 20A and between the semiconductor chips 20A, 20B and 20C, and may attach the substrate 10 and the semiconductor chips 20A, 20B and 20C to one another.

The first bonding pads 21 may be electrically connected with the coupling pads 13 of the substrate 10 through first bonding wires 41. The respective first bonding wires 41 may electrically connect the first bonding pads 21 of the uppermost semiconductor chip 20C and the first bonding pads 21 of the intermediate semiconductor chip 20B, may electrically connect the first bonding pads 21 of the intermediate semiconductor chip 20B and the first bonding pads 21 of the lowermost semiconductor chip 20A, and may electrically connect the first bonding pads 21 of the lowermost semiconductor chip 20A and the coupling pads 13 of the substrate 10.

The second bonding pads 22 of the semiconductor chips 20A, 20B and 20C may be electrically connected to the coupling pads 13 of the substrate 10 through second bonding wires 42A, 42B and 42C. The second bonding wire designated by the reference numeral 42A may electrically connect the second bonding pad 22 of the lowermost semiconductor chip 20A and the coupling pad 13 of the substrate 10, and the second bonding wire designated by the reference numeral 42B may electrically connect the second bonding pad 22 of the intermediate semiconductor chip 20B and the coupling pad 13 of the substrate 10. The second bonding wire designated by the reference numeral 42C may electrically connect the second bonding pad 22 of the uppermost semiconductor chip 20C and the connection pad 23B of the lowermost semiconductor chip 20A and may then electrically connect the connection pad 23B of the lowermost semiconductor chip 20A and the coupling pad 13 of the substrate 10.

In this regard, while the second bonding wire 42C may electrically connect the second bonding pad 22 of the uppermost semiconductor chip 20C and the coupling pad 13 of the substrate 10, the distance between target connection objects is substantially long. Therefore, in the case where the target connection objects are directly electrically connected, since the length of a bonding wire is lengthened, problems may be caused due to the substantial length of the bonding wire in that bonding wires are likely to short-circuit and bonding wires and semiconductor chips are likely to short-circuit. In order to cope with such a problem, in an embodiment, the connection pad 23B corresponding to the second circuit unit IC_22 which is electrically disconnected with the substrate 10 may be used as an intermediate routing point through which the second bonding wire 42C passes.

Although it is illustrated in an embodiment that the second bonding wire 42C passes through the connection pad 23B of the lowermost semiconductor chip 20A, the technical spirit of the embodiments are not limited to such, and it is to be noted that all cases where at least one among all the bonding wires including the first bonding wires 41 and the second bonding wires 42A, 42B and 42C formed in the package passes through at least one among the connection pads 23A, 23B and 23C corresponding to the second circuit units IC_21, IC_22 and IC_23 which are not used at a package level fall under the scope of protection of the embodiments.

Referring again to FIG. 11, In order to allow the connection pads 23A, 23B and 23C to be used as intermediate routing points of bonding wires, it is necessary to electrically disconnect the connection pads 23A, 23B and 23C and the second circuit units IC_21, IC_22 and IC_23.

In order to electrically disconnect the connection pads 23A, 23B and 23C and the second circuit units IC_21, IC_22 and IC_23, the respective semiconductor chips 20A, 20B and 20C may include blocking circuits BCs. The blocking circuits BCs may be respectively electrically connected between the connection pads 23A, 23B and 23C and the second circuit units IC_21, IC_22 and IC_23 corresponding to them, and may electrically disconnect the connection pads 23A, 23B and 23C and the second circuit units IC_21, IC_22 and IC_23 corresponding to them.

Figure 12:
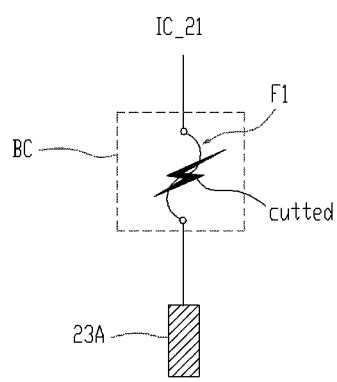
FIG. 12 is a representation of a circuit diagram schematically illustrating an example of the blocking circuit illustrated in FIG. 11.

An embodiment of the blocking circuit BC is illustrated in FIG. 12. In the following descriptions which will be made with reference to FIG. 12, the blocking circuit BC which may be electrically connected between the connection pad designated by the reference numeral 23A and the second circuit unit designated by the reference numeral IC_21 will be representatively described among the blocking circuits BCs, for the sake of convenience in explanation.

Referring to FIG. 12, a blocking circuit BC may be configured by a fuse F1 which is electrically connected between the connection pad 23A and the second circuit unit IC_21 corresponding to it. While not illustrated, the fuse F1 may be cut by a dummy pad enable signal having a high voltage level which is inputted through the connection pad 23A, before the assembly of a package. Therefore, the fuse F1 may be in a cut state when the package is assembled. The connection pad 23A and the second circuit unit IC_21 are electrically disconnected. Therefore, the connection pad 23A may be used as the intermediate routing point of a bonding wire.

While the blocking circuit BC electrically connected between the connection pad designated by the reference numeral 23A and the second circuit unit IC_21 corresponding to it is illustrated in the embodiments described above with reference to FIGS. 10 to 12, it is to be noted that the blocking circuits BCs electrically connected between the connection pads designated by the reference numerals 23B and 23C and the second circuit units IC_22 and IC_23 corresponding to them may have the same or substantially the configurations as the blocking circuit BC illustrated in FIG. 12. Therefore, similarly to the connection pad 23A, the connection pads 23B and 23C may be used as the intermediate routing points of bonding wires.

According to an embodiment, since it may not be necessary to form separate pads in the semiconductor chips 20A, 20B and 20C to input the dummy pad enable signal, a pad overcrowding issue due to the additional formation of the pads for the input of the dummy pad enable signal does not occur, whereby pad design efficiency may be improved. Also, since it is not necessary to form bonding wires which electrically connect the pads and a substrate for the input of the dummy pad enable signal, the number of bonding wires may be decreased and the difficulty of a wire bonding process may be lessened.

While it is illustrated in the embodiments described above with reference to FIGS. 1 to 12 that the dummy pad enable signal DUMMY_EN which is provided from an external device is used, it is to be noted that the dummy pad enable signal DUMMY_EN may be used by being generated in the semiconductor chips 20A, 20B and 20C, without using the dummy pad enable signal DUMMY_EN provided from an external device. Such an embodiment will become more apparent through the following descriptions which will be made with reference to FIGS. 13 to 15B.

Figure 13:
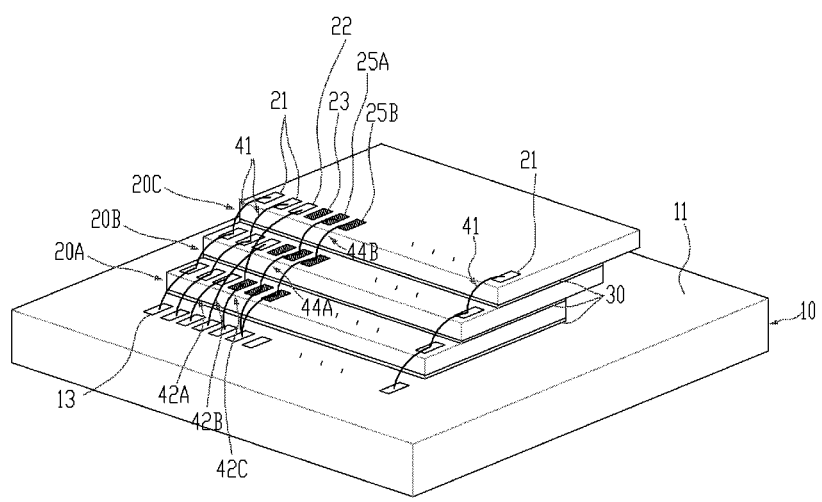
FIG. 13 is a perspective view illustrating a representation of a semiconductor stacked package in accordance with an embodiment.

Referring to FIG. 13, semiconductor chips 20A, 20B and 20C are stacked on a top surface 11 of a substrate 10 which is formed with a plurality of coupling pads 13. While not illustrated, a plurality of external electrodes may be formed on a bottom surface of the substrate 10 which faces away from the top surface 11 of the substrate 10, and external connection terminals such as solder balls may be attached to the external electrodes.

Figure 14:
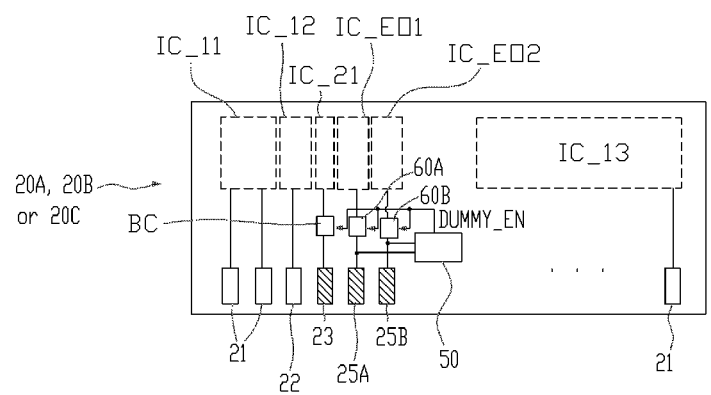
FIG. 14 is a view schematically illustrating a representation of an example of the semiconductor chip illustrated in FIG. 13.

Referring to FIG. 14, each of the semiconductor chips 20A, 20B and 20C may include a plurality of circuit units IC_11, IC_12, IC_13, IC_21, IC_EO1 and IC_EO2 to realize various functions necessary for chip operations. Furthermore, pads 21, 22, 23, 25A and 25B which respectively correspond to the circuit units IC_11, IC_12, IC_13, IC_21, IC_EO1 and IC_EO2 and are electrically coupled with corresponding circuit units IC_11, IC_12, IC_13, IC_21, IC_EO1 and IC_EO2 may be formed on the top surface of each of the respective semiconductor chips 20A, 20B and 20C.

Referring again to FIG. 13, the semiconductor chips 20A, 20B and 20C may be stacked in a step-like shape in such a manner that the pads 21, 22, 23, 25A and 25B are exposed. Adhesive members 30 may be formed between the substrate 10 and the semiconductor chip 20A and between the semiconductor chips 20A, 20B and 20C, and may attach the substrate 10 and the semiconductor chips 20A, 20B and 20C to one another.

Referring again to FIG. 14, the circuit units IC_11, IC_12, IC_13, IC_21, IC_EO1 and IC_EO2 may include, for example, a data storage circuit unit for storing data, a data processing circuit unit for processing data, a test logic circuit unit, and optional circuit units. The test logic circuit unit may be to test whether a chip is functioning as intended or not. Such a test logic circuit unit is used for a chip test at the final stage of a wafer level, and is not used at a package level. The optional circuit units are to apply the same chip to various kinds of packages and various different applications. Such optional circuit units may be used or not be used at a package level according to the kind of a package or an application to be applied. An optional circuit unit may be used by being enabled in the case where an enable signal is inputted through a bonding pad corresponding to it. In other words, in order to use an optional circuit unit, an enable signal should be inputted to a pad corresponding to an optional circuit unit which is to be used.

Among optional circuit units, there may be exclusive optional circuit units which are not capable of being simultaneously used. For example, an SD_SEL circuit for realizing a DDP option in which 2 chips are allocated to 1 CE signal and a QD_SEL circuit for realizing a QDP option in which 4 chips are allocated to 1 CE signal correspond to exclusive optional circuit units which are not capable of being simultaneously used. In FIG. 14, the circuit units designated by the reference symbols IC_EO1 and IC_EO2 represent exclusive optional circuit units.

Among the remaining circuit units IC_11, IC_12, IC_13 and IC_21 except the exclusive optional circuit units IC_EO1 and IC_EO2, the circuit units designated by the reference symbols IC_11, IC_12 and IC_13 may represent circuit units which are used at a package level, and the circuit unit designated by the reference symbol IC_21 may represent a circuit unit which is not used at a package level. In the following descriptions, for the sake of convenience in explanation, the circuit units IC_11, IC_12 and IC_13 which are used at a package level are defined as first circuit units, and the circuit unit IC_21 which is not used at a package level is defined as a second circuit unit. The first circuit units IC_11, IC_12 and IC_13, which are used at a package level, are electrically connected with the substrate 10, whereas the second circuit unit IC_21, which is not used at a package level, is electrically disconnected with the substrate 10.

Among the first circuit units IC_11, IC_12 and IC_13 of the semiconductor chips 20A, 20B and 20C, some circuit units may be electrically connected with the first circuit units of other semiconductor chips stacked together, and some circuit units may be electrically disconnected with the first circuit units of other semiconductor chips stacked together. In FIG. 14, the first circuit units designated by the reference symbols IC_11 and IC_13 represent first circuit units which are electrically connected with the first circuit units of other semiconductor chips stacked together, and the first circuit unit designated by the reference symbol IC_12 represents a first circuit unit which is electrically disconnected with the first circuit unit of other semiconductor chips stacked together. In the following descriptions, for the sake of convenience in explanation, the first circuit units IC_11 and IC_13, which are electrically connected with the first circuit units of other semiconductor chips stacked together, are defined as belonging to a first group, and the first circuit unit IC_12, which is electrically disconnected with the first circuit unit of other semiconductor chips stacked together, is defined as belonging to a second group.

Among the pads 21, 22 and 23, the pads designated by the reference numeral 21 may respectively correspond to the first circuit units IC_11 and IC_13 which belong to the first group, and may be electrically connected with the corresponding first circuit units IC_11 and IC_13. The pad designated by the reference numeral 22 may correspond to the first circuit unit IC_12 which belongs to the second group, and may be electrically connected with the corresponding first circuit unit IC_12. The pad designated by the reference numeral 23 may correspond to the second circuit unit IC_21, and may be electrically connected with the corresponding second circuit unit IC_21.

In the following descriptions, for the sake of convenience in explanation, the pads 21 which correspond to the first circuit units IC_11 and IC_13 of the first group are defined as first bonding pads, the pad 22 which corresponds to the first circuit unit IC_12 of the second group is defined as a second bonding pad, and the pad 23 which corresponds to the second circuit unit IC_21 is defined as a connection pad.

Referring again to FIG. 13, the first bonding pads 21 may be electrically connected with the coupling pads 13 of the substrate 10 through first bonding wires 41. The respective first bonding wires 41 may electrically connect the first bonding pads 21 of the uppermost semiconductor chip 20C and the first bonding pads 21 of the intermediate semiconductor chip 20B, may electrically connect the first bonding pads 21 of the intermediate semiconductor chip 20B and the first bonding pads 21 of the lowermost semiconductor chip 20A, and may electrically connect the first bonding pads 21 of the lowermost semiconductor chip 20A and the coupling pads 13 of the substrate 10.

The second bonding pads 22 of the semiconductor chips 20A, 20B and 20C may be electrically connected with the coupling pads 13 of the substrate 10 through second bonding wires 42A, 42B and 42C. The second bonding wire designated by the reference numeral 42A may electrically connect the second bonding pad 22 of the lowermost semiconductor chip 20A and the coupling pad 13 of the substrate 10, and the second bonding wire designated by the reference numeral 42B may electrically connect the second bonding pad 22 of the intermediate semiconductor chip 20B and the coupling pad 13 of the substrate 10.

The second bonding wire designated by the reference numeral 42C may electrically connect the second bonding pad 22 of the uppermost semiconductor chip 20C and the connection pad 23 of the lowermost semiconductor chip 20A and may then electrically connect the connection pad 23 of the lowermost semiconductor chip 20A and the coupling pad 13 of the substrate 10. In this regard, while the second bonding wire 42C may electrically connect the second bonding pad 22 of the uppermost semiconductor chip 20C and the coupling pad 13 of the substrate 10, the distance between target connection objects is substantially long. Therefore, in these cases where the target connection objects are directly electrically connected, since the length of a bonding wire is lengthened, problems may be caused due to the substantial length of the bonding wire in that bonding wires may be likely to short-circuit and bonding wires and semiconductor chips may be likely to short-circuit. In order to cope with such a problem, in an embodiment, the connection pad 23 corresponding to the second circuit unit IC_21 which is electrically disconnected with the substrate 10 may be used as the intermediate routing point of the second bonding wire 42C.

Although it is illustrated in an embodiment that the second bonding wire 42C passes through the connection pad 23 of the lowermost semiconductor chip 20A, the technical spirit of these embodiments are not limited to such, and it is to be noted that all cases where at least one among all the bonding wires including the first bonding wires 41 and the second bonding wires 42A, 42B and 42C formed in the semiconductor stacked package passes through the connection pad 23 corresponding to the second circuit unit IC_21 which is electrically disconnected with the substrate 10 fall under the scope of protection of the embodiments.

In order to allow the connection pad 23 to be used as the intermediate routing point of a bonding wire, it may be necessary to electrically disconnect the connection pad 23 and the second circuit unit IC_21.

Referring to FIG. 14, in order to electrically disconnect the connection pad 23 and the second circuit unit IC_21, each of the semiconductor chips 20A, 20B and 20C may include a blocking circuit BC. The blocking circuit BC may be electrically connected between the connection pad 23 and the second circuit unit IC_21 corresponding to it, and may electrically disconnect the connection pad 23 and the second circuit unit IC_21 corresponding to it. The configuration of the blocking circuit BC is substantially the same as the configuration of the blocking circuits BCs described above with reference to FIGS. 4 to 8 and 10. Therefore, repeated descriptions for the same component will be omitted herein.

In order to provide a dummy pad enable signal DUMMY_EN to the blocking circuit BC, each of the semiconductor chips 20A, 20B and 20C may include a dummy pad enable signal generation unit 50.

The dummy pad enable signal generation unit 50 may be electrically connected to the bonding pads 25A and 25B which correspond to the exclusive optional circuit units IC_EO1 and IC_EO2, and may generate the dummy pad enable signal DUMMY_EN in response to the enable signals of high levels which are inputted through the bonding pads 25A and 25B, in the case where enables signals having high levels are simultaneously inputted to the bonding pads 25A and 25B which correspond to the exclusive optional circuit units IC_EO1 and IC_EO2. An embodiment of the dummy pad enable signal generation unit 50 is illustrated in FIG. 15A.

Figure 15A:
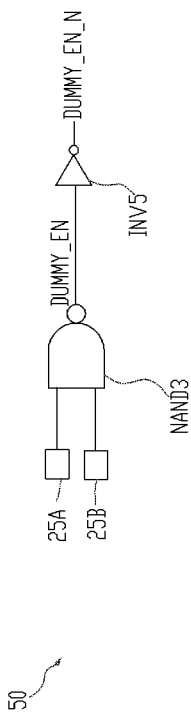
FIG. 15A is a circuit diagram illustrating a representation of an example of the dummy pad enable signal generation unit illustrated in FIG. 14.

Referring to FIG. 15A, the dummy pad enable signal generation unit 50 may include a third NAND gate NAND3 which NANDs the signals inputted through the bonding pads 25A and 25B corresponding to the exclusive optional circuit units IC_EO1 and IC_EO2 and generates the dummy pad enable signal DUMMY_EN, and a fifth inverter INV5 which inverts the dummy pad enable signal DUMMY_EN and generates a dummy pad enable bar signal DUMMY_EN_N.

In these cases where the enable signals having high levels are inputted substantially simultaneously or simultaneously to the bonding pads 25A and 25B corresponding to the exclusive optional circuit units IC_EO1 and IC_EO2, in order to prevent the occurrence of an operation error that the exclusive optional circuit units IC_EO1 and IC_EO2 are simultaneously enabled by the enable signals inputted through the bonding pads 25A and 25B, each of the semiconductor chips 20A, 20B and 20C may include disable signal providing units 60A and 60B.

The disable signal providing units 60A and 60B are respectively electrically connected between the exclusive optional circuit units IC_EO1 and IC_EO2 and the bonding pads 25A and 25B corresponding to them, and may provide disable signals D_EN1 and D_EN2 (see FIG. 15B) to the exclusive optional circuit units IC_EO1 and IC_EO2 in response to the dummy pad enable signal DUMMY_EN which is inputted from the dummy pad enable signal generation unit 50. An embodiment of the disable signal providing units 60A and 60B is illustrated in FIG. 15B.

Figure 15B:
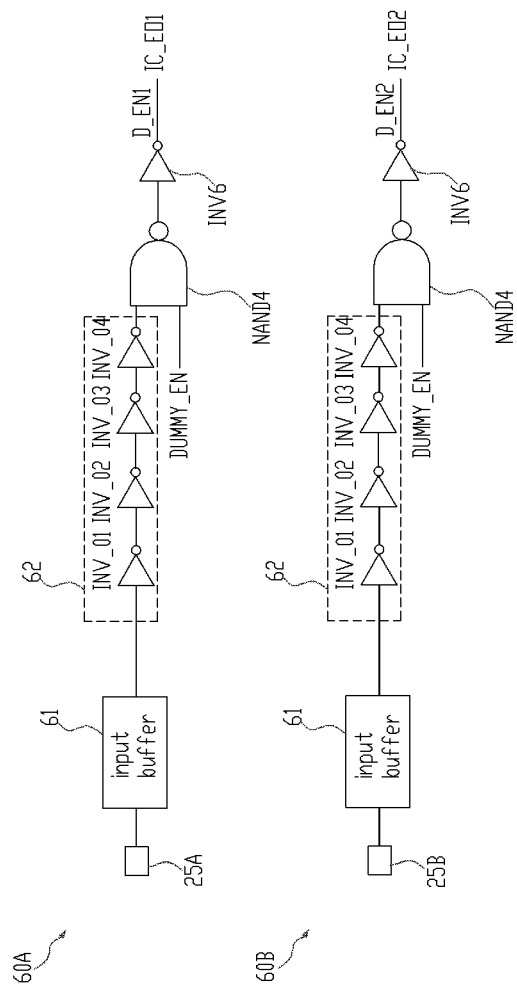
FIG. 15B is a circuit diagram illustrating a representation of examples of the disable signal generation units illustrated in FIG. 14.

Referring to FIG. 15B, the disable signal providing units 60A and 60B may have substantially the same configurations. In detail, each of the disable signal providing units 60A and 60B may include an input buffer 61, a delay circuit 62, a fourth NAND gate NAND4, and a sixth inverter INV6.

The input buffer 61 buffers and outputs a signal which is inputted through each of the bonding pads 25A and 25B corresponding to each of the exclusive optional circuit units IC_EO1 and IC_EO2. The delay circuit 62 is configured by a plurality of inverters INV_01 to INV_04 which are electrically connected in series, and delays the signal which is outputted from the input buffer 61, by a predetermined time to synchronize timing with the dummy pad enable signal DUMMY_EN provided from the dummy pad enable signal generation unit 50. The fourth NAND gate NAND4 NANDs the dummy pad enable signal DUMMY_EN and the output signal of the delay circuit 62. The sixth inverter INV6 is electrically connected between the fourth NAND gate NAND4 and the exclusive optional circuit unit IC_EO1 or IC_EO2, inverts the output signal of the fourth NAND gate NAND4, generates the disable signal D_EN1 or D_EN2, and provides the generated disable signal D_EN1 or D_EN2 to the exclusive optional circuit unit IC_EO1 or IC_EO2.

Referring again to FIG. 13, in order to ensure that the enable signals having a high level are simultaneously inputted or substantially simultaneously inputted to the bonding pads 25A and 25B corresponding to the exclusive optional circuit units IC_EO1 and IC_EO2, the bonding pads 25A and 25B corresponding to the exclusive optional circuit units IC_EO1 and IC_EO2 may be electrically connected with a connection pad for a power supply voltage, among the coupling pads 13 of the substrate 10, through fourth bonding wires 44A and 44B.

Referring again to FIGS. 13 and 15A, if enable signals of a power supply voltage level, that is, a high level, are simultaneously inputted or substantially simultaneously inputted to the bonding pads 25A and 25B corresponding to the exclusive optional circuit units IC_EO1 and IC_EO2 through the fourth bonding wires 44A and 44B from the coupling pad for a power supply voltage, of the substrate 10, the third NAND gate NAND3 of the dummy pad enable signal generation unit 50 may NAND the enable signals which are inputted through the bonding pads 25A and 25B, and may output the dummy pad enable signal DUMMY_EN having a low level.

Figure 15C:
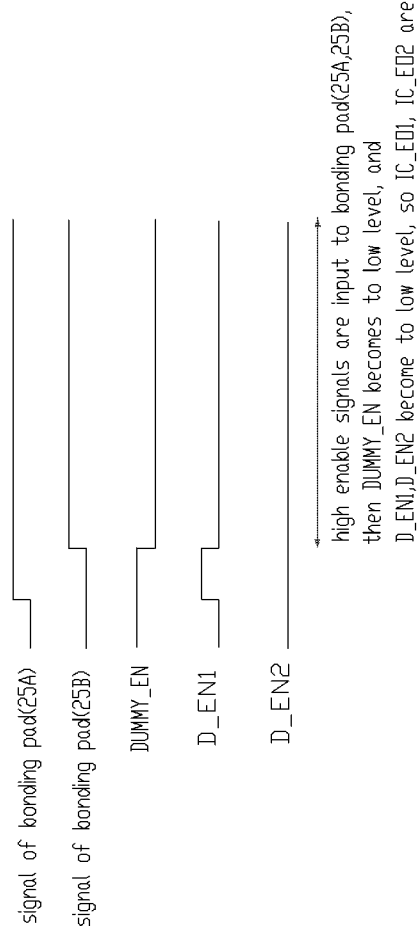
FIG. 15C is an operation waveform diagram of a representation of signals associated with the circuit diagrams illustrated in FIGS. 15A and 15B.

Referring to FIGS. 15B and 15C, if the dummy pad enable signal DUMMY_EN having a low level is inputted from the dummy pad enable signal generation unit 50, the fourth NAND gates NAND4 of the disable signal providing units 60A and 60B output signals having a high level, and the sixth inverters INV6 invert the output signals of the fourth NAND gates NAND4 and provide the disable signals D_EN1 and D_EN2 having a low level to the exclusive optional circuit units IC_EO1 and IC_EO2. Accordingly, the exclusive optional circuit units IC_EO1 and IC_EO2 are disabled by the disable signals D_EN1 and D_EN2 having a low level which are provided from the disable signal providing units 60A and 60B, and are not used.

In an embodiment, since the semiconductor stacked package is configured using the semiconductor chips 20A, 20B and 20C each of which has the dummy pad enable signal generation unit 50 and the disable signal providing units 60A and 60B, the dummy pad enable signal DUMMY_EN may be generated and used by using the enable signals which are inputted through the bonding pads 25A and 25B corresponding to the exclusive optional circuit units IC_EO1 and IC_EO2, while not influencing the operations of the exclusive optional circuit units IC_EO1 and IC_EO2. Accordingly, because it is not necessary to form separate pads in the semiconductor chips 20A, 20B and 20C for the input of the dummy pad enable signal DUMMY_EN, a pad overcrowding issue due to the additional formation of the pads for the input of the dummy pad enable signal DUMMY_EN may not occur, whereby pad design efficiency may be improved.

As is apparent from the above descriptions, according to the embodiments, since a semiconductor stacked package is formed using semiconductor chips which have blocking circuits for electrically disconnecting circuit units (for example, a test logic circuit unit and a non-used optional circuit unit) not used at a package level from connection pads corresponding to them, the connection pads corresponding to the circuit units not used at a package level may be used as intermediate routing points through which bonding wires pass. Therefore, because bonding pads of a semiconductor chip positioned remotely from a substrate and coupling pads of the substrate may be electrically connected using not long bonding wires but relatively short bonding wires, the difficulty of a bonding wire forming process may be lessened, and it may be possible to cope with the problems caused due to the use of long bonding wires in that bonding wires may be likely to short-circuit or bonding wires and semiconductor chips may be likely to short-circuit. As a consequence, it may be possible to improve the reliability of bonding wires. Further, because it is not necessary to additionally form separate pads in the semiconductor chips to be used as the intermediate routing points of the bonding wires, overcrowding of pads due to the additional pad formation may be prevented, and pads may be disposed at desired positions, whereby pad design efficiency may be improved.

The above-described semiconductor stacked package may be applied to various electronic systems and electronic devices.

Figure 17:
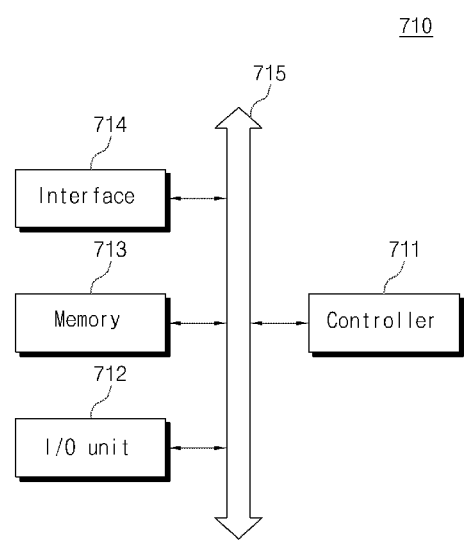
FIG. 17 is a block diagram illustrating a representation of an electronic system to which the semiconductor stacked package in accordance with the embodiments is applied.

Referring to FIG. 17, the semiconductor stacked package in accordance with the embodiments may be applied to an electronic system 710. The electronic system 710 may include a controller 711, an input/output unit 712, and a memory 713. The controller 711, the input/output unit 712 and the memory 713 may be coupled with one another through a bus 715 which provides a data movement path.

The controller 711 may include at least one microprocessor, at least one digital signal processor, at least one microcontroller, and at least one of logic circuits capable of performing the same functions as these components. The input/output unit 712 may include at least one selected among a keypad, a keyboard, a display device, a touch screen, and so forth.

The memory 713 may include the semiconductor stacked package in accordance with the embodiments. The memory 713 as a device for storing data may store data or/and commands to be executed by the controller 711 or the like. The memory 713 may include a volatile memory device such as a DRAM or/and a nonvolatile memory device such as a flash memory device. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver. Such an interface 714 may be coupled with the memory 713, the input/output unit 712 and the controller 711 through the bus 715.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the cases where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 18:
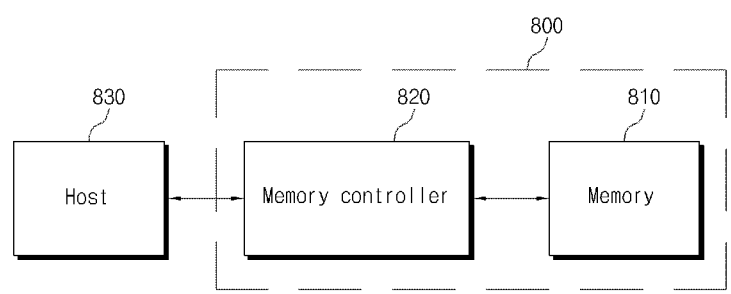
FIG. 18 is a block diagram illustrating a representation of an example of an electronic device which includes the semiconductor stacked package in accordance with the embodiments.

Referring to FIG. 18, the semiconductor stacked package in accordance with the embodiments may be provided in the form of a memory card 800. For example, the memory card 800 may include a memory 810 such a nonvolatile memory device and a memory controller 820. The memory 810 and the memory controller 820 may store data or read stored data.

The memory 810 may include the semiconductor stacked package in accordance with the embodiments, and the memory controller 820 may control the memory 810 to read stored data or store data, in response to a read/write request from a host 830.

While various embodiments have been described above, it will be understood to those skilled in the art that the embodiments described are by way of example only. Accordingly, the semiconductor stacked package described herein should not be limited based on the described embodiments.

What is claimed is:

1. A semiconductor stacked package comprising:
   a substrate formed with a plurality of coupling pads;
   a plurality of semiconductor chips stacked on the substrate;
   first circuit units disposed on each of the semiconductor chips, and electrically connected with the coupling pads by the medium of bonding pads;
   second circuit units disposed on each of the semiconductor chips and electrically disconnected with the coupling pads;
   connection pads disposed on each of the semiconductor chips and corresponding to the second circuit units;
   blocking circuits coupled between the second circuit units and the connection pads; and
   bonding wires electrically connecting the bonding pads and the coupling pads.

2. The semiconductor stacked package according to claim 1, wherein the semiconductor chips are stacked in a step-like shape such that the bonding pads and the connection pads are exposed.

3. The semiconductor stacked package according to claim 1, wherein the first circuit units of each of the semiconductor chips comprise:
   first circuit units of a first group electrically connected with first circuit units of other semiconductor chips stacked together; and
   first circuit units of a second group electrically disconnected with first circuit units of other semiconductor chips stacked together.

4. The semiconductor stacked package according to claim 3, wherein the bonding pads comprise:
   first bonding pads corresponding to the first circuit units of the first group; and
   second bonding pads corresponding to the first circuit units of the second group.

5. The semiconductor stacked package according to claim 4, wherein the bonding wires comprise:
   first bonding wires electrically connecting first bonding pads of the semiconductor chips and the coupling pads of the substrate; and
   second bonding wires respectively electrically connecting second bonding pads of the semiconductor chips and the coupling pads of the substrate.

6. The semiconductor stacked package according to claim 5, wherein at least one of the first bonding wires and the second bonding wires is formed to pass through the connection pad.

7. The semiconductor stacked package according to claim 4, wherein the connection pads have substantially the same size as the first and second bonding pads.

8. The semiconductor stacked package according to claim 4, wherein the connection pads are larger in size than the first and second bonding pads.

9. The semiconductor stacked package according to claim 1, wherein the blocking circuit comprises a PMOS transistor having a source which is electrically connected to the connection pad, a drain which is electrically connected to the second circuit unit and a gate which is configured for receiving a dummy pad enable signal.

10. The semiconductor stacked package according to claim 1, wherein the blocking circuit comprises an NMOS transistor having a drain which is electrically connected to the connection pad, a source which is electrically connected to the second circuit unit and a gate which is configured for receiving a dummy pad enable signal.

11. The semiconductor stacked package according to claim 1, wherein the blocking circuit comprises a fuse which is electrically connected between the second circuit unit and the connection pad.

12. The semiconductor stacked package according to claim 1, wherein the blocking circuit comprises an input buffer, the input buffer being coupled between the second circuit unit and the connection pad and configured to electrically disconnect the second circuit unit and the connection pad in response to a dummy pad enable signal.

13. The semiconductor stacked package according to claim 12, wherein the input buffer comprises:
a first inverter configured to invert an input enable bar signal, and generate an input enable signal;
a first NAND gate configured to NAND the input enable signal and the dummy pad enable signal, and generate an input buffer enable control bar signal;
a second inverter configured to invert the input buffer enable control bar signal, and generate an input buffer enable control signal;
a first PMOS transistor having one end which is electrically connected to a power supply voltage and a gate configured for receiving the input buffer enable control bar signal;
a second PMOS transistor having one end which is electrically connected to the other end of the first PMOS transistor and a gate electrically connected to the connection pad;
a first NMOS transistor having one end electrically connected to the other end of the second PMOS transistor, the other end electrically connected to a ground voltage and a gate electrically connected to the connection pad;
a second NMOS transistor having one end electrically connected to the other end of the second PMOS transistor, the other end electrically connected to the ground voltage and a gate configured for receiving the input buffer enable control bar signal;
a third PMOS transistor having one end electrically connected to the power supply voltage, the other end electrically connected to the second circuit unit and a gate connected to the one end of the second NMOS transistor; and
a third NMOS transistor having one end electrically connected to the second circuit unit, the other end electrically connected to the ground voltage and a gate electrically connected to the one end of the second NMOS transistor.

14. The semiconductor stacked package according to claim 1, wherein the blocking circuit comprises an output buffer coupled between the second circuit unit and the connection pad and configured for electrically disconnecting the second circuit unit and the connection pad in response to a dummy pad enable signal.

15. The semiconductor stacked package according to claim 14, wherein the output buffer comprises:
a third inverter configured to invert an output enable bar signal, and generate an output enable signal;
a second NAND gate configured to NAND the output enable signal and the dummy pad enable signal, and generate an output buffer enable control bar signal;
a fourth inverter configured to invert the output buffer enable control bar signal, and generate an output buffer enable control signal;
a fourth PMOS transistor having one end electrically connected to the power supply voltage and a gate configured for receiving the output buffer enable control bar signal;
a fifth PMOS transistor having one end electrically connected to the other end of the fourth PMOS transistor and a gate electrically connected to the second circuit unit;
a fourth NMOS transistor having one end electrically connected to the other end of the fifth PMOS transistor and a gate electrically connected to the second circuit unit;
a fifth NMOS transistor having one end electrically connected to the other end of the fourth NMOS transistor, the other end connected to the ground voltage and a gate configured for receiving the output buffer enable control signal;
a sixth PMOS transistor having one end electrically connected to the power supply voltage, the other end electrically connected to the other end of the fifth PMOS transistor and a gate configured for receiving the output buffer enable control signal;
a seventh PMOS transistor having one end electrically connected to the power supply voltage, the other end electrically connected to the connection pad through a first resistor and a gate electrically connected to the other end of the sixth PMOS transistor;
an eighth PMOS transistor having one end electrically connected to the power supply voltage and a gate configured for receiving the output buffer enable control bar signal;
a ninth PMOS transistor having one end electrically connected to the other end of the eighth PMOS transistor and a gate electrically connected to the second circuit unit;
a sixth NMOS transistor having one end electrically connected to the other end of the ninth PMOS transistor and a gate electrically connected to the second circuit unit;
a seventh NMOS transistor having one end electrically connected to the other end of the sixth NMOS transistor, the other end electrically connected to the ground voltage and a gate configured for receiving the output buffer enable control signal;
an eighth NMOS transistor having one end electrically connected to the other end of the ninth PMOS transistor, the other end electrically connected to the ground voltage and a gate configured for receiving the output buffer enable control bar signal; and
a ninth NMOS transistor having one end electrically connected to the connection pad through a second resistor, the other end electrically connected to the ground voltage and a gate electrically connected to the one end of the eighth NMOS transistor.

16. The semiconductor stacked package according to claim 1, wherein the blocking circuit comprises a transfer gate which is coupled between the second circuit unit and the connection pad and configured for electrically disconnecting the second circuit unit and the connection pad in response to a dummy pad enable signal.

17. The semiconductor stacked package according to claim 16, wherein the transfer gate comprises:
a tenth NMOS transistor electrically connected between the second circuit unit and the connection pad, and having a gate configured for receiving the dummy pad enable signal;
a fifth inverter configured to invert the dummy pad enable signal, and generate a dummy pad enable bar signal; and a tenth PMOS transistor electrically connected between the second circuit unit and the connection pad, and having a gate configured for receiving the dummy pad enable bar signal.

18. The semiconductor stacked package according to claim 1, wherein each of the semiconductor chips further comprises a third bonding pad which is electrically coupled with the blocking circuits and configured for providing a dummy pad enable signal to the blocking circuits.

19. The semiconductor stacked package according to claim 18, further comprising:
a third bonding wire configured to electrically connect the third bonding pad of each of the semiconductor chips and the coupling pad of the substrate to provide the dummy pad enable signal to the third bonding pad.

20. The semiconductor stacked package according to claim 1, wherein the circuit units comprise at least one optional circuit unit which is included in the first circuit units or the second circuit units according to a kind of a package or an application to be applied.

21. The semiconductor stacked package according to claim 1, wherein the first circuit units comprise at least one data storage circuit unit for storing data.

22. The semiconductor stacked package according to claim 1, wherein the first circuit units comprise at least one data processing circuit unit for processing data.

23. The semiconductor stacked package according to claim 1, wherein the second circuit units comprise at least one test logic circuit unit configured for determining whether the semiconductor chip is functioning.

24. The semiconductor stacked package according to claim 20, wherein the optional circuit unit includes exclusive optional circuit units which are not capable of being simultaneously used.

25. The semiconductor stacked package according to claim 24, wherein each of the semiconductor chips further comprises:
a dummy pad enable signal generation unit electrically connected to bonding pads corresponding to the exclusive optional circuit units, and configured for generating the dummy pad enable signal in response to enable signals being simultaneously provided to the bonding pads corresponding to the exclusive optional circuit units; and
disable signal providing units respectively electrically connected between the exclusive optional circuit units and the bonding pads corresponding to them, and configured to provide disable signals to the exclusive optional circuit units in response to the dummy pad enable signal.

26. The semiconductor stacked package according to claim 25, further comprising:
fourth bonding wires configured to electrically connect the bonding pads corresponding to the exclusive optional circuit units and the coupling pads of the substrate to provide the enable signals to the bonding pads corresponding to the exclusive optional circuit units.

27. The semiconductor stacked package according to claim 25, wherein the dummy pad enable signal generation unit comprises:
a third NAND gate configured to NAND signals inputted through the bonding pads corresponding to the exclusive optional circuit units, and generate the dummy pad enable signal; and
a fifth inverter configured to invert the dummy pad enable signal and generate the dummy pad enable bar signal.

28. The semiconductor stacked package according to claim 25, wherein each of the disable signal providing units comprises:
a fourth NAND gate configured to NAND a signal inputted through the bonding pad electrically coupled with the fourth NAND gate and the dummy pad enable signal; and
a sixth inverter configured to invert an output signal of the fourth NAND gate, generate the disable signal and output the disable signal to the exclusive optional circuit unit.

29. The semiconductor stacked package according to claim 28, wherein each of the disable signal providing units further comprises:
an input buffer configured to buffer a signal inputted through the bonding pad electrically connected with the input buffer; and
a delay circuit configured to delay a signal outputted from the input buffer, and provide a resultant signal to an input side of the third NAND gate.

* * * * *